United States Patent
Tagawa et al.

(10) Patent No.: US 9,971,069 B2
(45) Date of Patent: May 15, 2018

(54) LENS ARRAY AND LIGHT SOURCE UNIT

(71) Applicant: Konica Minolta, Inc., Tokyo (JP)

(72) Inventors: Tomohiko Tagawa, Sagamihara (JP); Akihiro Fujimoto, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days. days.

(21) Appl. No.: 15/522,151

(22) PCT Filed: Nov. 11, 2015

(86) PCT No.: PCT/JP2015/081703
§ 371 (c)(1),
(2) Date: Apr. 26, 2017

(87) PCT Pub. No.: WO2016/080258
PCT Pub. Date: May 26, 2016

(65) Prior Publication Data
US 2017/0315273 A1    Nov. 2, 2017

(30) Foreign Application Priority Data
Nov. 21, 2014    (JP) ................... 2014-236088

(51) Int. Cl.
*G02B 3/00*    (2006.01)
*G02B 27/10*    (2006.01)
(Continued)

(52) U.S. Cl.
CPC ......... *G02B 3/0056* (2013.01); *G02B 3/0075* (2013.01); *G03G 15/0409* (2013.01);
(Continued)

(58) Field of Classification Search
CPC ........ G02B 3/00; G02B 3/005; G02B 3/0056; G02B 3/0062; G02B 3/0068;
(Continued)

(56) References Cited

U.S. PATENT DOCUMENTS 4,670,095 A * 6/1987 Negishi .................... G02B 1/10
                                                    216/26
7,760,215 B2 * 7/2010 Inoue ...................... B41J 2/451
                                                    347/130
(Continued)

FOREIGN PATENT DOCUMENTS

JP    H11-227247 A    8/1999
JP    2001091877 A    4/2001
(Continued)

OTHER PUBLICATIONS

International Search Report dated Feb. 2, 2016 for PCT/JP2015/081703 and English translation.
(Continued)

*Primary Examiner* — Loha Ben
(74) *Attorney, Agent, or Firm* — Lucas & Mercanti, LLP (57) ABSTRACT

A lens array includes a flat plate-shaped base part, a plurality of lenses, a plurality of columnar light guiding parts and a plurality of light shielding parts. The lenses are formed on one surface of the base part. The columnar light guiding parts are formed on another surface of the base part at points corresponding to the lenses. The light shielding parts are formed at least on lateral surfaces of the light guiding parts.

10 Claims, 7 Drawing Sheets

(51) Int. Cl.
*G03G 15/04* (2006.01)
*G03B 21/14* (2006.01)
*H01L 27/146* (2006.01)
*G03B 21/16* (2006.01)
*H04N 1/03* (2006.01)
*H04N 1/031* (2006.01)

(52) U.S. Cl.
CPC .............. *G03B 21/14* (2013.01); *G03B 21/16* (2013.01); *G03G 15/04* (2013.01); *H01L 27/14623* (2013.01); *H01L 27/14627* (2013.01); *H04N 1/0306* (2013.01); *H04N 1/0318* (2013.01)

(58) Field of Classification Search
CPC .. G02B 3/0075; G02B 27/02; G02B 27/0961; G03G 15/04; G03G 15/0409; G03G 15/60; G03G 2215/0132; H01L 27/1462; H01L 27/14623; H01L 27/14627; G03B 21/2013; G03B 21/2033; G03B 21/2053; G03B 21/14; G03B 21/16; B41J 2/447; B41J 2/45; B41J 2/451; H04N 1/028; H04N 1/0281; H04N 1/0306; H04N 1/0318; H04N 1/036
USPC .... 359/619, 622, 625, 626, 628; 353/38, 56, 353/97; 358/474, 475, 509; 362/606, 362/611, 612, 608, 615; 257/431–435, 257/443; 348/294, 475; 399/218
See application file for complete search history.

(56) References Cited

U.S. PATENT DOCUMENTS

| | | | |
|---|---|---|---|
| 7,764,429 B2 * | 7/2010 | Nomura | G02B 3/0006 347/238 |
| 8,593,704 B2 * | 11/2013 | Ogi | G02B 3/0062 358/474 |
| 9,389,341 B2 * | 7/2016 | Nemoto | B29D 11/00298 |
| 9,462,150 B2 * | 10/2016 | Matsuzawa | H04N 1/0281 |
| 9,477,170 B2 * | 10/2016 | Shiraishi | G03G 15/0409 |
| 9,478,574 B2 * | 10/2016 | Lenchenkov | H01L 27/14627 |
| 9,778,591 B2 * | 10/2017 | Shiraishi | G03G 15/0409 |

FOREIGN PATENT DOCUMENTS

| | | |
|---|---|---|
| JP | 2009037199 A | 2/2009 |
| JP | 2009037200 A | 2/2009 |
| JP | 2010072557 A | 4/2010 |
| JP | 2011051311 A | 3/2011 |

OTHER PUBLICATIONS

IPRP dated Feb. 2, 2016 for corresponding International Application No. PCT/JP2015/081703 and English translation; Applicant: Konica Minolta, Inc.; Total of 11 pages.
Extended European Search Report dated Feb. 19, 2018 from corresponding European Application No. 15861826.4.

* cited by examiner

LENS ARRAY AND LIGHT SOURCE UNIT

CROSS REFERENCE TO RELATED APPLICATION

This Application is a 371 of PCT/JP2015/081703 filed on Nov. 11, 2015, which, in turn, claimed the priority of Japanese Patent Application No. JP 2014-236088 filed on Nov. 21, 2014, both applications are incorporated herein by reference.

TECHNICAL FIELD

The present invention relates to a lens array and a light source unit, in particular, to a lens array and a light source unit to be preferably used, for example, in a print head of an electrophotographic printer.

BACKGROUND ART

Conventionally, an electrophotographic printer being an image forming apparatus has a built-in light source unit, called a print head, which selectively emits light to a photoreceptor, thereby forming latent images. (See Patent Documents 1 to 3.)

In the print head of Patent Document 1, a head substrate (450; glass substrate) provided with a group of light emitting elements (410), a light shielding member (440) in which light guiding holes (4410) are formed, and a micro lens array (430) are fixed to a case (420) in a state of being stacked in this order. More specifically, the head substrate is arranged between the case and a back cover (470), and the back cover is pressed to and fixed to the case with a retainer (460). The light shielding member and the micro lens array are fitted into and fixed to an opening part of the case. In this configuration, light of the light emitting elements passes through the light guiding holes, and forms, with the micro lens array, images on a photoreceptor.

The print head of Patent Document 2 employs the same configuration as the print head of Patent Document 1. Besides, in Patent Document 2, there is disclosed an embodiment in which (i) a head substrate (450) and a light shielding member (440) and (ii) the light shielding member and a micro lens array (4301) are each glued with an adhesive (436).

In the print head of Patent Document 3, LED elements (30) are fixed to a holder (34) via a wiring substrate (33), and a lens array unit (1) in which lens plates (11) including micro lenses (12) are fixed to a light shielding member (13) is also fixed to the holder.

RELATED ART DOCUMENTS

Patent Documents

Patent Document 1: Japanese Patent Application Publication No. 2009-37199 (See Paragraphs [0047] to [0052], FIG. 3, and FIG. 4.)
Patent Document 2: Japanese Patent Application Publication No. 2009-37200 (See Paragraphs [0046] to [0051], FIG. 3, FIG. 4, Paragraphs [0096] to [0097], and FIG. 9.)
Patent Document 3: Japanese Patent Application Publication No. 2010-72557 (See Paragraphs [0013] to [0022] and FIG. 3 to FIG. 5.)

SUMMARY OF THE INVENTION

Problems to be Solved by the Invention

Because in the configurations of Patent Documents 1 and 2, a large number of components, which includes the case in addition to the head substrate, the light shielding member and the micro lens array, are used, burdens in terms of time and costs, for example, for stock management, assembling and processing accuracy of components are large.

In the configuration of Patent Document 3 too, as with the configurations of Patent Documents 1 and 2, because the number of components, which includes the holder, is large, burdens in terms of time and costs entailed by that are large.

Further, in the configurations of Patent Documents 1 and 2, the micro lens array is divided so that distortion due to thermal expansion of the micro lens array is absorbed. However, materials of the head substrate, the light shielding member and the micro lens array and material of the case are different, and accordingly difference is generated in linear expansion coefficient. Hence, depending on the material of the case, because of change in environmental temperature, position shift occurs in these components, and optical axis deviation occurs between the light emitting elements and the micro lens array. This makes it impossible for light of the light emitting elements to form clear images.

In the embodiment disclosed in FIG. 9 of Patent Document 2 too, because of change in environmental temperature, the adhered components are pulled to each other by expansion or contraction, and distortion due to warping or twisting of the components, i.e. the head substrate, the light shielding member and the micro lens array, occurs therebetween, and as with the above, optical axis deviation occurs between the light emitting elements and the micro lens array.

In the configuration of Patent Document 3 too, as with the configurations of Patent Documents 1 and 2, because the wiring substrate, the light shielding member and the lens plates are fixed to the holder, optical axis deviation may occur depending on the material of the holder.

Therefore, main objects of the present invention are to provide a lens array which can contribute to reduction of the number of components and to provide a light source unit which can prevent optical axis deviation from occurring and also contribute to reduction of the number of components.

Means for Solving the Problems

In order to solve the above problems, according to a first aspect of the present invention, there is provided a lens array including: a flat plate-shaped base part; a plurality of lenses formed on one surface of the base part; a plurality of columnar light guiding parts formed on another surface of the base part at points corresponding to the lenses; and a plurality of light shielding parts formed at least on lateral surfaces of the light guiding parts.

According to a second aspect of the present invention, there is provided a light source unit including: a light emitting substrate including a plurality of light emitting elements; and a lens array having a plurality of lenses corresponding to the plurality of light emitting elements, wherein the lens array includes: a flat plate-shaped base part; the plurality of lenses formed on one surface of the base part; a plurality of columnar light guiding parts formed on another surface of the base part at points corresponding to the lenses; and a plurality of light shielding parts formed at least on lateral surfaces of the light guiding parts, and the lens array is fixed directly to the light emitting substrate.

Advantageous Effects of the Invention

According to the first aspect of the present invention, the light guiding parts are formed on the base part, and the light shielding parts are formed at least on the lateral surfaces of the light guiding parts. Hence, the lens array can be fixed directly to a light emitting substrate without depending on a light shielding member or a fixing member (holding member), such as a case or a holder. Therefore, the present invention can contribute to reduction of the number of components.

According to the second aspect of the present invention, the light shielding parts are formed at least on the lateral surfaces of the light guiding parts of the lens array, and the lens array is fixed directly to the light emitting substrate, so that the lens array and the light shielding parts are positioned with respect to the light emitting substrate. Hence, the lens array and the light emitting substrate are positioned without depending on a separate light shielding member or a fixing member, such as a case or a holder. Therefore, the present invention can prevent optical axis deviation from occurring and also contribute to reduction of the number of components.

EMBODIMENTS FOR CARRYING OUT THE INVENTION

Hereinafter, preferred embodiments of the present invention are described with reference to the drawings.

First Embodiment

Figure 1A:
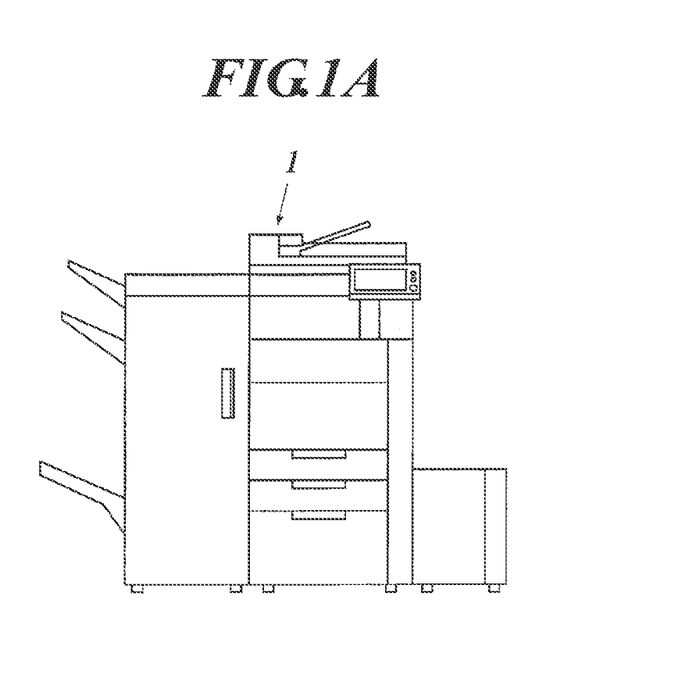
FIG. 1A shows a schematic configuration of an image forming apparatus.

As shown in FIG. 1A, an image forming apparatus 1 is, what is called, an electrophotographic printer which forms images on paper, and has a built-in image forming unit 10 (see FIG. 1B) to transfer toner for developing to paper.

Figure 1B:
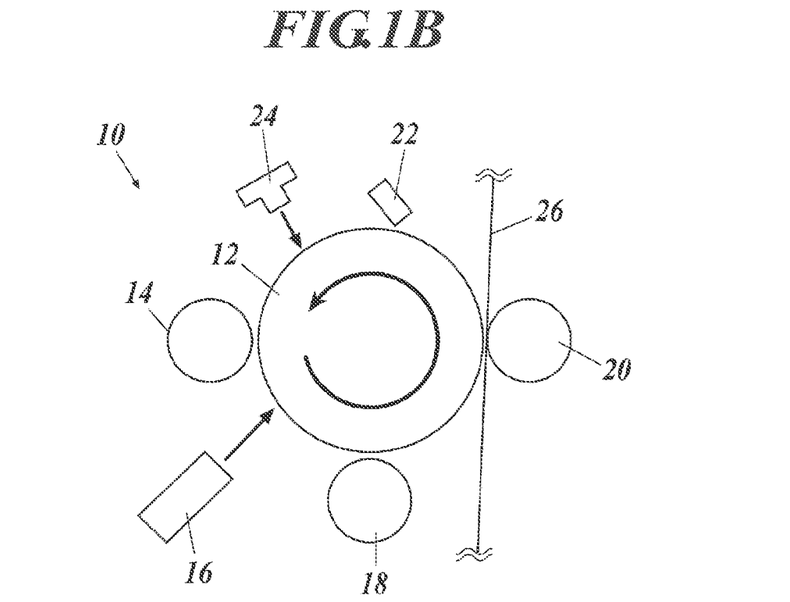
FIG. 1B shows a schematic configuration of an image forming unit.

As shown in FIG. 1B, the image forming unit 10 includes multiple components around a photoreceptor 12. Around the photoreceptor 12, mainly, a charging roller 14, a print head 16, a developing device 18, a transfer device 20, a cleaning device 22 and a charge neutralizing device 24 are installed in this order from the upstream side to the downstream side of a rotation direction of the photoreceptor 12.

To the charging roller 14, a bias having polarity according to the charge polarity of toner is applied from a power supply device (not shown), and the charging roller 14 charges the photoreceptor 12.

The print head 16 is constituted of a light source unit 30 (see FIG. 2) having light emitting elements and lenses, and emits light to the photoreceptor 12 from the light emitting elements via the lenses, thereby forming electrostatic latent images on the charged photoreceptor 12.

The developing device 18 supplies toner to the photoreceptor 12, thereby developing, with the toner, the electrostatic latent images formed on the photoreceptor 12.

The transfer device 20 rotates while abutting the photoreceptor 12 via paper 26, thereby transferring the toner on the photoreceptor 12 to the paper 26.

The cleaning device 22 is constituted of, what is called, a blade and the like, and scrapes and removes the remaining toner on the photoreceptor 12 therefrom.

The charge neutralizing device 24 uniformly sheds light on the photoreceptor 12, thereby removing the remaining electric charges on the photoreceptor 12.

According to the image forming apparatus 1, these components perform their respective actions described above on the photoreceptor 12 so as to form images on the paper 26.

Although only one image forming unit 10 is shown in FIG. 1B, a plurality of image forming units which house toners of different colors may be provided so as to form color images. Further, although toner images are transferred directly from the photoreceptor 12 to the paper 26 in FIG. 1B, toner images may be transferred to the paper 26 via an intermediate transfer body.

Figure 2:
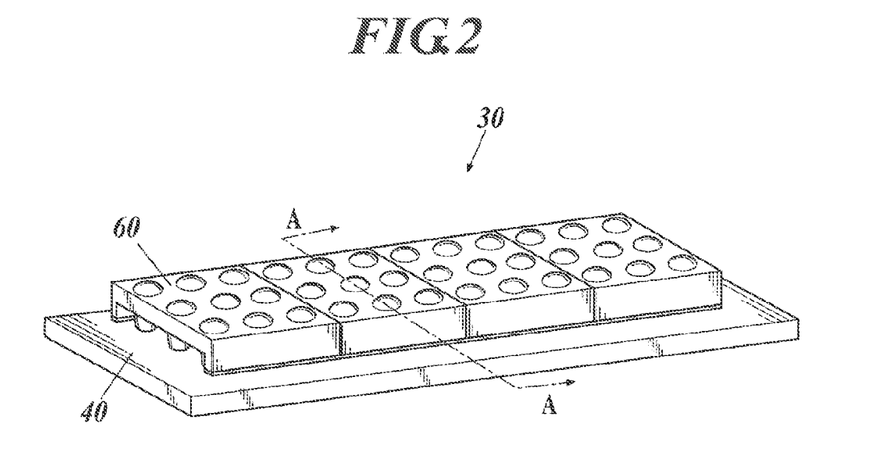
FIG. 2 is a perspective view showing a schematic configuration of a light source unit.
Figure 3:
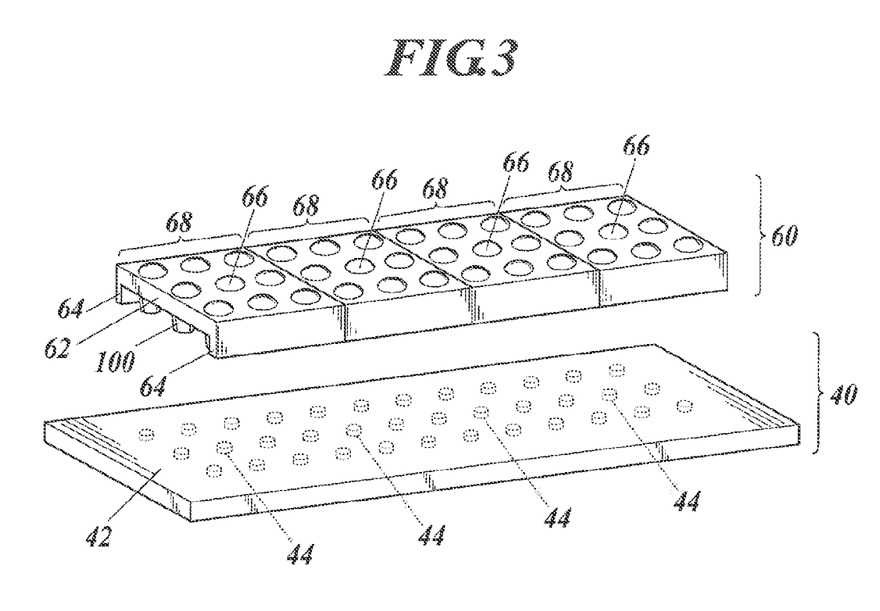
FIG. 3 is an exploded perspective view of that shown in FIG. 2.

As shown in FIG. 2 and FIG. 3, the light source unit 30 mainly includes a light emitting substrate 40 and a lens array 60, and has a configuration in which the lens array 60 is placed on the light emitting substrate 40.

As shown in FIG. 3 in detail, the light emitting substrate 40 includes a transparent substrate 42 and a plurality of light emitting elements 44. The transparent substrate 42 is a glass substrate which is transparent and light-transmissive. The light emitting elements 44 are formed on the lower surface of the transparent substrate 42. The light emitting elements 44 are constituted of LED (Light Emitting Diode) elements, organic EL (Electro Luminescence) elements or the like, preferably organic EL elements.

The lens array 60 is an optical member which is made of resin and includes: a flat plate-shaped base part 62; two leg parts 64 which are disposed at the both ends in the shorter direction of the base part 62 and each extend in the longer direction thereof; a plurality of lenses 66; and a plurality of light guiding parts 100. The base part 62, the leg parts 64, the lenses 66 and the light guiding parts 100 are integrally formed. The base part 62 is a part serving as a base of the lens array 60, and on one surface (upper surface) of the base part 62, the lenses 66 are formed, and on the other surface (lower surface) of the base part 62, the leg parts 64 and the light guiding parts 100 are formed, and the leg parts 64 support the base part 62.

Figure 4:
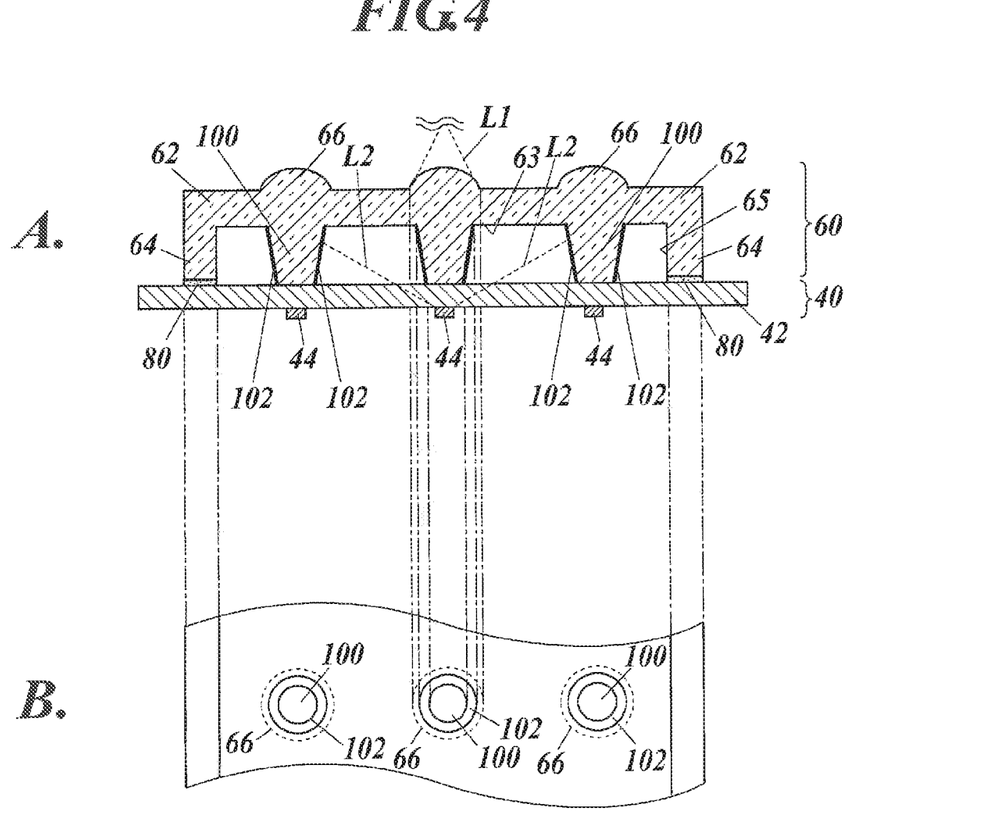
FIG. 4 shows, in "A", a cross-sectional view along A-A line in FIG. 2, and in "B", a bottom view of and around the section.

As shown in FIG. 2 and FIG. 4, the lens array 60 is fixed directly to the light emitting substrate 40.

As shown in "A" in FIG. 4 in detail, the leg parts 64 of the lens array 60 are fixed to the transparent substrate 42 of the light emitting substrate 40 with an adhesive 80. The leg parts 64 may be fixed to the transparent substrate 42 by welding. In these instances, the lens array 60 is fixed directly to the light emitting substrate 40.

In the invention of this application, the "fixed directly" means that the lens array 60 and the light emitting substrate 40 are fixed to each other by using a method, such as adhesion or welding, such that the lens array 60 is positioned and fixed with respect to the light emitting substrate 40 approximately in the optical axis direction of the lenses 66 of the lens array 60. A configuration in which an adhesive is present between the lens array 60 and the light emitting substrate 40 and a configuration in which a separate sheet-shaped member other than an adhesive is present between the lens array 60 and the light emitting substrate 40 are also within the range of the "fixed directly".

The light guiding parts 100 of the lens array 60 are columnar, and the lower ends thereof abut the transparent substrate 42 of the light emitting substrate 40. Herein, the "columnar" means a vertically-extending shape which includes not only a cylindrical shape and a prismatic shape each having the same shape and the same size at any point in the vertical direction but also a shape having different shapes and/or sizes at points in the vertical direction, such as a tapered shape. In the embodiment(s), the light guiding parts 100 each have a tapered shape such that they taper off as they are apart from the lens array 60.

As shown in "B" in FIG. 4, the lenses 66 and the light guiding parts 100 of the lens array 60 are concentric when viewed from the bottom.

As shown in "A" and "B" in FIG. 4, light shielding parts 102 are formed at least on the lateral surfaces of the light guiding parts 100. The light shielding parts 102 are parts having been subjected to an outside light enter prevention process. The "outside light enter prevention process" includes, for example, attaching a black light-shielding film(s), forming a black light-shielding layer(s), and embossing the lateral surfaces themselves of the light guiding parts 100. In addition to the lateral surfaces of the light guiding parts 100, the light shielding parts 102 may be formed on the lower surface 63 of the base part 62 and/or the inner surfaces 65 of the leg parts 64.

As shown in FIG. 3, the lens array 60 is made up of four units 68 and fixed to the light emitting substrate 40 in units. In each of the four units 68, a predetermined number of lenses 66 are formed. For each unit 68, 3 (columns)×3 (rows)=9 lenses 66 are formed.

As to the light guiding parts 100 too, for each unit 68, 3 (columns)×3 (rows)=9 light guiding parts 100 are formed, so that the light guiding parts 100 correspond to the lenses 66 one-to-one.

As shown in "A" in FIG. 4, the lens array 60 is fixed to the light emitting substrate 40 in a state of being positioned such that the optical axes of the lenses 66 face the centers of their respective corresponding light emitting elements 44. According to the light source unit 30, the light emitting elements 44 of the light emitting substrate 40 and the lenses 66 and the light guiding parts 100 of the lens array 60 correspond to each other one-to-one, and when each light emitting element 44 emits light, this light L1 passes through the transparent substrate 42 and its corresponding light guiding part 100, enters its corresponding lens 66, and forms an image on the photoreceptor 12 with the lens 66.

In this instance, light L2 emitted from the light emitting element 44 and radially spread is blocked (or absorbed) by its corresponding light shielding part 102 as unnecessary light so that the light L2 is prevented from entering the next lens 66 which does not correspond to the light emitting element 44.

The number of units 68 in the lens array 60 can be changed, and the number of lenses 66 in the unit 68 can also be changed.

Figure 5A:
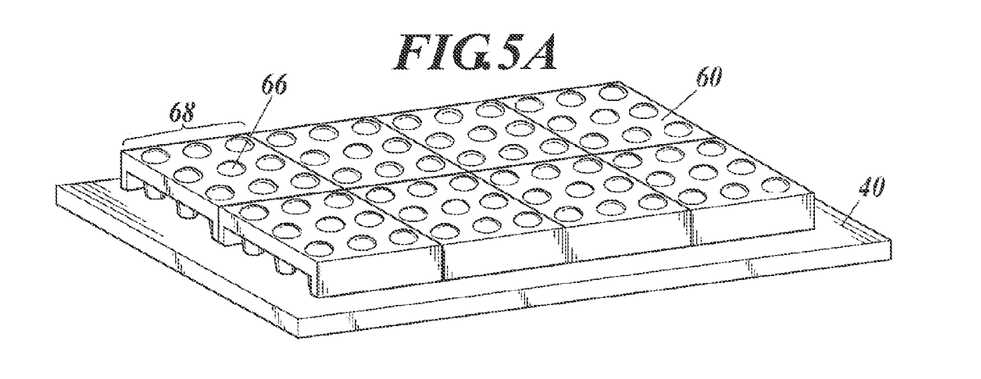
FIG. 5A shows an instance where the number of units in a lens array has been changed.

For example, as shown in FIG. 5A, the number of units 68 may be increased by increasing the number of rows of units 68 while keeping the number of lenses 66 in each unit 68 unchanged.

Figure 5B:
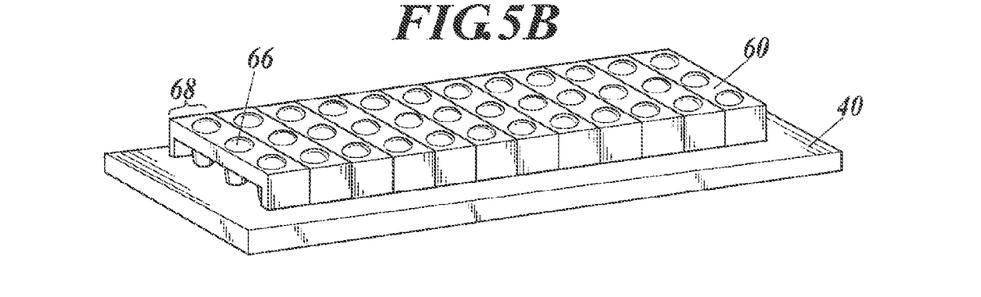
FIG. 5B shows an instance where the number of units in the lens array and the number of lenses in each unit have been changed.

The number of units 68 may be increased, as shown in FIG. 5B, by reducing the number of lenses 66 in each unit 68 (by dividing the lenses 66 by column).

Figure 5C:
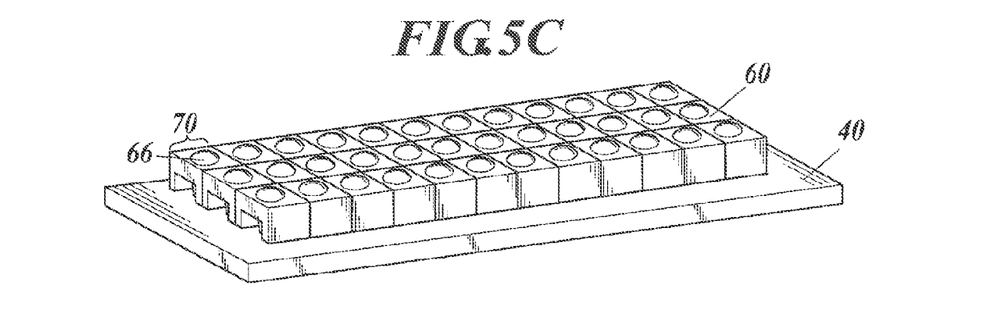
FIG. 5C shows another instance where the number of units in the lens array and the number of lenses in each unit have been changed.

As shown in FIG. 5C, the lens array 60 may be made up of a large number of simple units 70 into which the lens array 60 is divided by lens 66, and fixed to the light emitting substrate 40 in lenses.

Figure 5D:
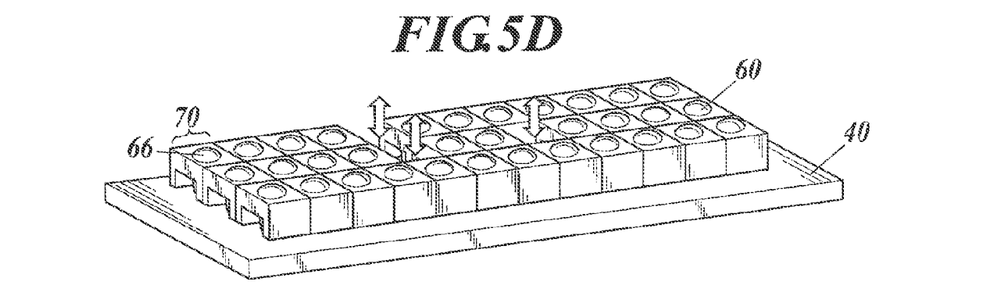
FIG. 5D shows that the lens array can be replaced in lenses.

According to this form, as shown in FIG. 5D, the lens array 60 can be replaced in lenses from defective pieces to non-defective pieces.

On the lens array 60, another lens array 60 may be placed in units or in lenses. The number of lens arrays 60 to be piled up can also be changed.

Figure 6A:
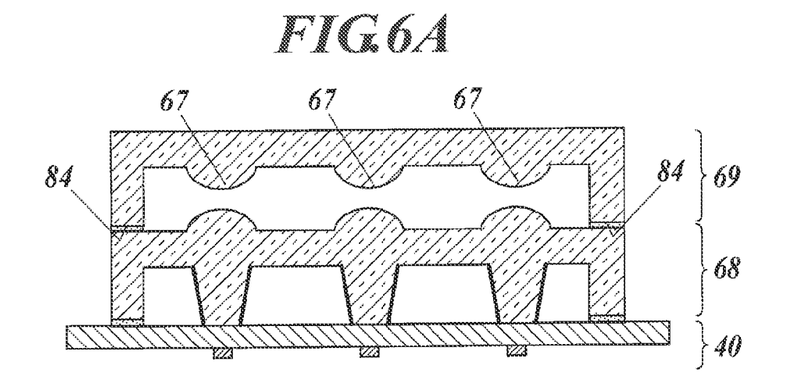
FIG. 6A shows an instance where on the lens array, another lens array is placed in units.

FIG. 6A shows an instance where the lens arrays are stacked in units.

In the instance shown in FIG. 6A, on the one shown in "A" in FIG. 4, a unit 69 having a flat upper surface and a lower surface with convex lenses 67 formed thereon is placed.

In the instance shown in FIG. 6A, to the upper surface of the unit 68 on the lower side, another unit 69 can be fixed with an adhesive 84. Alternatively, the unit 69 on the upper side may be fixed to the unit 68 on the lower side by welding.

Figure 6B:
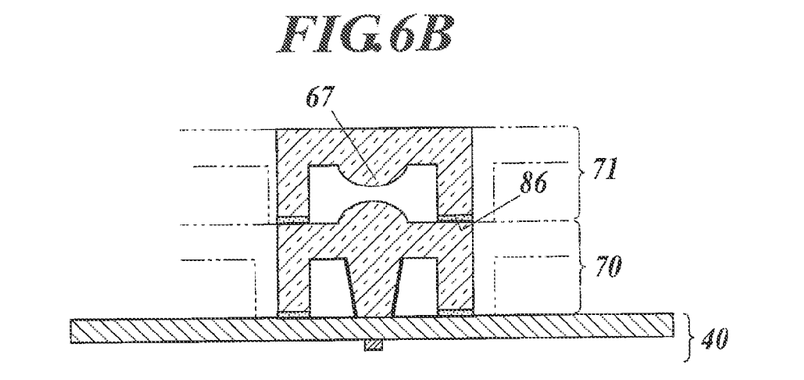
FIG. 6B shows an instance where on the lens array, another lens array is placed in lenses.

When the lens arrays 60 are piled up in lenses too, as shown in FIG. 6B, to the upper surface of the simple unit 70 on the lower side, another simple unit 71 can be fixed with an adhesive 86. Alternatively, the simple unit 71 on the upper side may be fixed to the simple unit 70 on the lower side by welding.

According to the embodiment described above, the light shielding parts 102 are formed on the lateral surfaces of the light guiding parts 100 of the lens array 60, and the leg parts 64 of the lens array 60 are fixed directly to the light emitting substrate 40.

According to the embodiment, the light emitting substrate 40 and the lens array 60 are positioned without depending on a light shielding member or a fixing member (holding member), such as a case or a holder. Hence, it is unnecessary to give consideration to difference in linear expansion coefficient between these components and a fixing member or a light shielding member, optical axis deviation between the light emitting elements 44 of the light emitting substrate 40 and the lenses 66 of the lens array 60 can be prevented from occurring, and the number of components can be reduced at least by the light shielding member and the fixing member.

In particular, because no light shielding member and no fixing member are necessary, and no component is present between the light emitting elements 44 of the light emitting substrate 40 and the lens array 60, a factor to cause optical axis deviation can be eliminated, and optical axis deviation can be prevented from occurring.

Also, time and costs can be shortened and reduced by those for manufacturing light shielding members and fixing members, and in manufacturing the light source unit 30, burdens in terms of time and costs, for example, for stock management, assembling and processing accuracy of components can be reduced.

Because the lens array 60 is made up of a plurality of units 68, a mold to manufacture (mold resin into) the lens array 60 can be miniaturized to a size corresponding to the size of the unit 68 from the size of the lens array 60 itself.

This mold enables molding with space saving.

Further, during molding, this mold is more likely to stabilize molding temperature than a large mold and can improve maintainability, and after molding, allows the resin to be cooled in a short time and can realize high cycle molding.

Because the lens array 60 is made up of a plurality of units 68, the number of lenses 66 to be examined at once can be reduced from the number of lenses 66 in the lens array 60 to the number of lenses 66 in the unit 68.

In this instance, because the number of optical surfaces of the lenses 66 is small, when the optical surfaces of the lenses 66 are corrected, time and costs for processing and measurement can be saved.

The number of units 68 in the lens array 60 and the number of lenses 66 in the unit 68 can be changed, and also the units 68 can be changed for the simple units 70.

Thus, expansion or contraction of the lens array 60 due to change in environmental temperature can be minimized in units or in lenses. Further, degree of freedom in design in the longer direction or the shorter direction of the light source unit 30 increases, and a wide variety of lens arrays 60 can be provided in small lot, so that change in size of the light emitting substrate 40 and change in the number of light emitting elements 44 can be readily handled.

Second Embodiment

A second embodiment is different from the first embodiment mainly in the following aspects.

Figure 7:
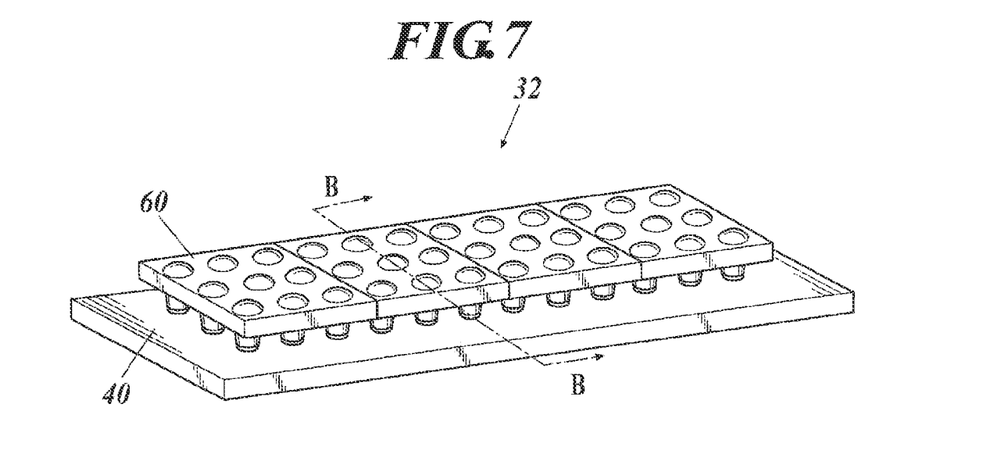
FIG. 7 is a perspective view showing a schematic configuration of a light source unit according to a second embodiment.
Figure 8:
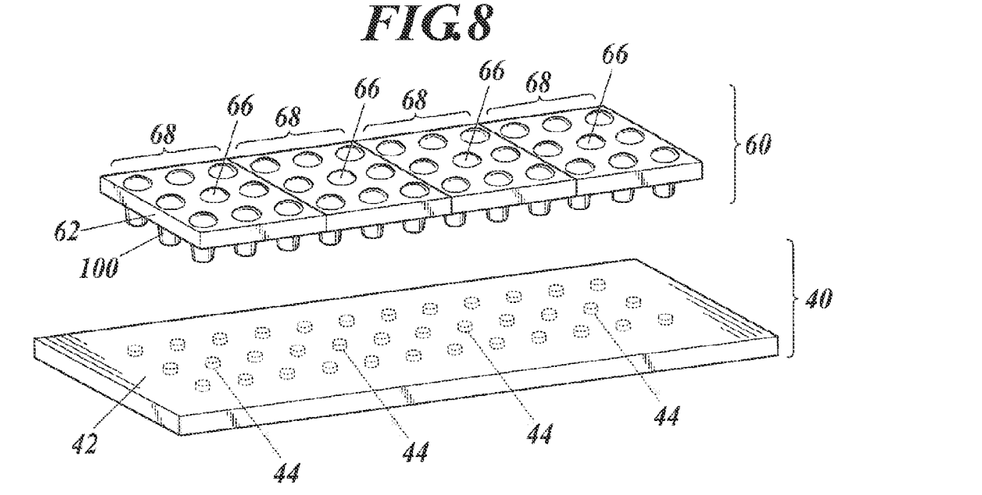
FIG. 8 is an exploded perspective view of that shown in FIG. 7.

As shown in FIG. 7 and FIG. 8, a light source unit 32 mainly includes a light emitting substrate 40 and a lens array 60, and has a configuration in which the lens array 60 is placed on the light emitting substrate 40.

Figure 9:
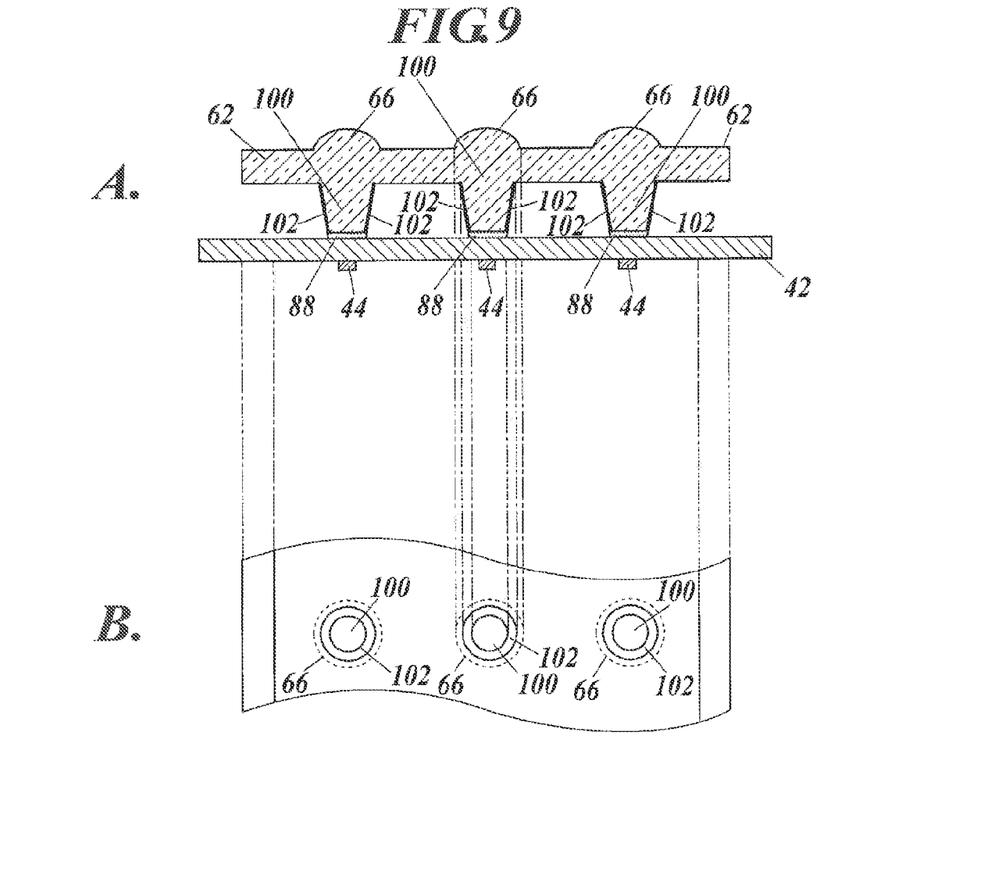
FIG. 9 shows, in "A", a cross-sectional view along B-B line in FIG. 7, and in "B", a bottom view of and around the section.

As shown in "A" in FIG. 9, the light guiding parts 100 of the lens array 60 are fixed to the transparent substrate 42 of the light emitting substrate 40 with an adhesive 88. The light guiding parts 100 may be fixed to the transparent substrate 42 by welding.

The light source unit 32 does not have parts equivalent to the leg parts 64 (see "A" in FIG. 4) of the lens array 60 of the first embodiment, and the lower surfaces of the light guiding parts 100 are fixed directly to the upper surface of the transparent substrate 42 with the adhesive. As compared with the first embodiment, the shape of the lens array 60 is simple, so that the lens array 60 is easily molded. Further, the bottoms (lower surfaces) of the light guiding parts 100 serving as the plane of incidence can be optically connected to the light emitting substrate 40 with the adhesive, and light use efficiency can be increased.

According to the light source unit 32, when each light emitting element 44 emits light, this light L1 passes through the transparent substrate 42, the adhesive 88 and the light guiding part 100, enters the lens 66, and forms an image on the photoreceptor 12 with the lens 66.

As a matter of course, the number of units 68 in the lens array 60 can be changed, and the number of lenses 66 in the unit 68 can also be changed.

Figure 10A:
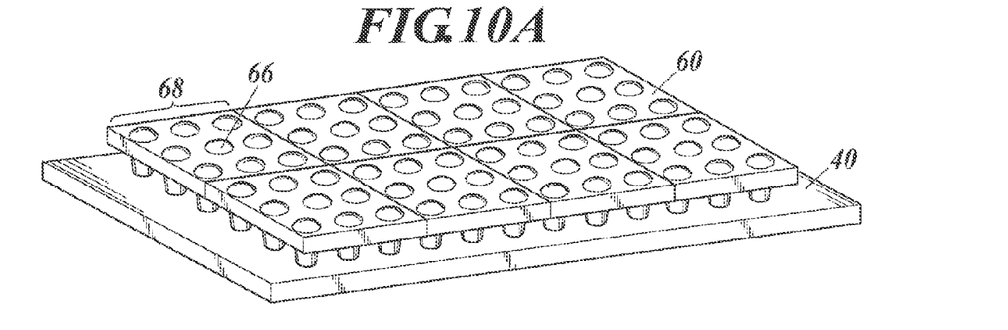
FIG. 10A shows an instance where the number of units in a lens array has been changed.

For example, as shown in FIG. 10A, the number of units 68 may be increased, keeping the number of lenses 66 in each unit 68 unchanged.

Figure 10B:
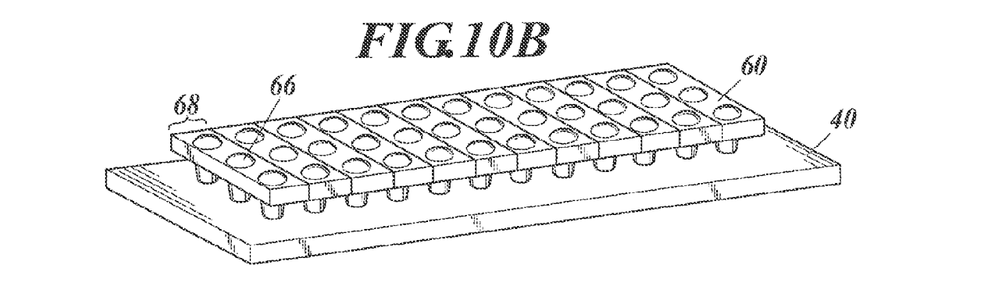
FIG. 10B shows an instance where the number of units in the lens array and the number of lenses in each unit have been changed.

The number of units 68 may be increased, as shown in FIG. 10B, by reducing the number of lenses 66 in each unit 68 (by dividing the lenses 66 by column).

Figure 10C:
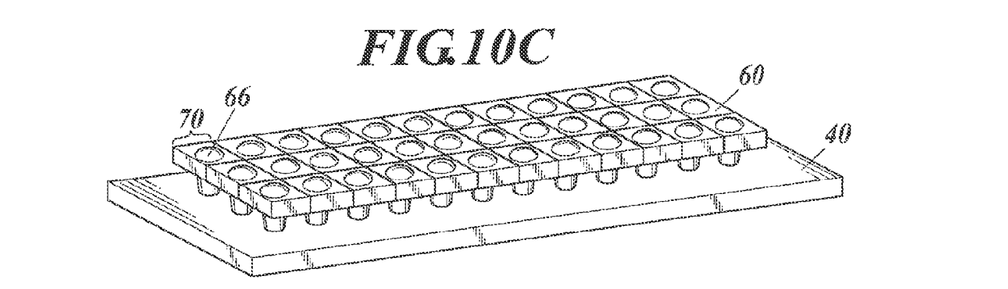
FIG. 10C shows another instance where the number of units in the lens array and the number of lenses in each unit have been changed.

As shown in FIG. 10C, the lens array 60 may be made up of a large number of simple units 70 into which the lens array 60 is divided by lens 66, and fixed to the light emitting substrate 40 in lenses.

Figure 10D:
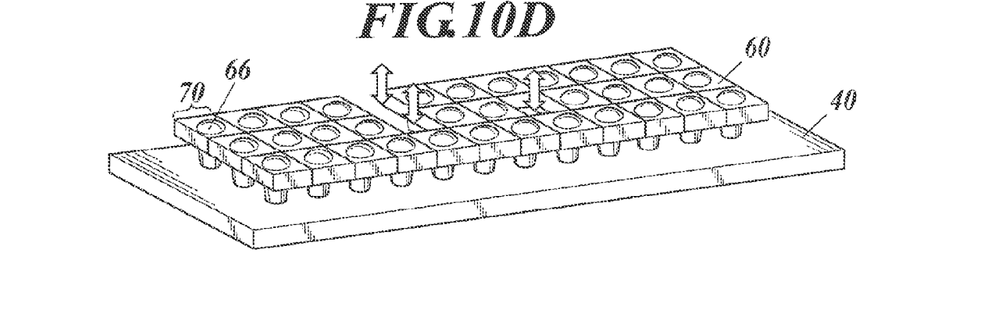
FIG. 10D shows that the lens array can be replaced in lenses.

According to this form, as shown in FIG. 10D, the lens array 60 can be replaced in lenses from defective pieces to non-defective pieces.

This embodiment has the same effects as the first embodiment.

INDUSTRIAL APPLICABILITY

The present invention relates to a lens array and a light source unit to be used, for example, in a print head of an electrophotographic printer, and can be preferably used, in particular, to prevent optical axis deviation from occurring and contribute to reduction of the number of components.

DESCRIPTION OF REFERENCE NUMERALS

1 Image Forming Apparatus
10 Image Forming Unit
12 Photoreceptor
14 Charging Roller
16 Print Head
18 Developing Device
20 Transfer Device
22 Cleaning Device
24 Charge Neutralizing Device
26 Paper
30 Light Source Unit
40 Light Emitting Substrate
42 Transparent Substrate
44 Light Emitting Element
60 Lens Array
62 Base Part
64 Leg Part
66 Lens
68 Unit
70 Simple Unit
80, 84, 86, 88 Adhesive
100 Light Guiding Part
102 Light Shielding Part

The invention claimed is:
1. A lens array comprising:
a flat plate-shaped base part;

a plurality of lenses formed on one surface of the base part;

a plurality of columnar light guiding parts formed on another surface of the base part at points corresponding to the lenses; and a plurality of light shielding parts formed at least on lateral surfaces of the light guiding parts.

2. The lens array according to claim 1, wherein the lens array is made up of a plurality of units each including a predetermined number of lenses.

3. The lens array according to claim 1, wherein the lens array is divided by lens.

4. A light source unit comprising:

a light emitting substrate including a plurality of light emitting elements; and a lens array having a plurality of lenses corresponding to the plurality of light emitting elements, wherein the lens array includes:
  a flat plate-shaped base part;
  the plurality of lenses formed on one surface of the base part;
  a plurality of columnar light guiding parts formed on another surface of the base part at points corresponding to the lenses; and
  a plurality of light shielding parts formed at least on lateral surfaces of the light guiding parts, and the lens array is fixed directly to the light emitting substrate.

5. The light source unit according to claim 4, wherein:
the lens array has leg parts which support the base part, and
the leg parts of the lens array are fixed to the light emitting substrate.

6. The light source unit according to claim 5, wherein the leg parts or the light guiding parts of the lens array are fixed to the light emitting substrate with an adhesive or by welding.

7. The light source unit according to claim 4, wherein the light guiding parts of the lens array are fixed to the light emitting substrate.

8. The light source unit according to claim 4, wherein:
the lens array is made up of a plurality of units each including a predetermined number of lenses, and
the lens array is fixed to the light emitting substrate in units.

9. The light source unit according to claim 8, wherein on the lens array, another lens array is placed in units or in lenses.

10. The light source unit according to claim 4, wherein:
the lens array is divided by lens, and
the lens array is fixed to the light emitting substrate in lenses.

* * * * *